United States Patent
Chen

(10) Patent No.: US 10,989,970 B2
(45) Date of Patent: *Apr. 27, 2021

(54) DISPLAY PANEL HAVING ELECTROSTATIC DISCHARGE CIRCUIT AND DISPLAY DEVICE

(71) Applicants: HKC Corporation Limited, Shenzhen (CN); Chongqing HKC Optoelectronics Technology Co., Ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 184 days.

This patent is subject to a terminal disclaimer.

(21) Appl. No.: 16/325,749

(22) PCT Filed: May 12, 2017

(86) PCT No.: PCT/CN2017/084056
§ 371 (c)(1),
(2) Date: Feb. 15, 2019

(87) PCT Pub. No.: WO2018/205238
PCT Pub. Date: Nov. 15, 2018

(65) Prior Publication Data
US 2019/0204693 A1 Jul. 4, 2019

(30) Foreign Application Priority Data
May 9, 2017 (CN) .......................... 201710320964.8

(51) Int. Cl.
*G02F 1/136* (2006.01)
*G02F 1/1362* (2006.01)
(Continued)

(52) U.S. Cl.
CPC ......... *G02F 1/136204* (2013.01); *G09G 3/20* (2013.01); *G09G 3/3648* (2013.01);
(Continued)

(58) Field of Classification Search
CPC ......... G09G 3/3648; G09G 2300/0809; G09G 2330/04; G09G 3/20; G09G 2300/0426; G02F 1/136204; G02F 2202/22
See application file for complete search history.

(56) References Cited

U.S. PATENT DOCUMENTS 6,043,971 A * 3/2000 Song ................ G02F 1/136204
349/40
10,762,862 B2 * 9/2020 Chen ........................ G09G 3/20
(Continued)

FOREIGN PATENT DOCUMENTS

CN     102957973 A     3/2013
CN     103943611 A     7/2014
(Continued)

OTHER PUBLICATIONS

Meijuan MA, the International Searching Authority written comments, Feb. 2018, CN.
Meijuan MA, the international Searching Report Feb. 2018, CN.

*Primary Examiner* — Rafael O De Leon Domenech

(57) ABSTRACT

The present application disclose a display panel and display device, including a substrate, and an electrostatic discharge circuit disposed on the substrate and including a voltage gate high terminal (VGH terminal), a voltage gate low terminal (VGL terminal), an electrostatic input end and a common voltage terminal (VCOM terminal) coupled with compo-
(Continued)

nents of the display panel; and a first discharge circuit, where an output end of the first discharge circuit is respectively connected to the voltage gate high terminal and the voltage gate low terminal, and a control end and an input end of the first discharge circuit are connected to the electrostatic input end; and a second discharge circuit, where an input end of the second discharge circuit is connected to the electrostatic input end, and an output end of the second discharge circuit is connected to the common voltage terminal.

20 Claims, 9 Drawing Sheets

(51) Int. Cl.
  *G09G 3/36* (2006.01)
  *G09G 3/20* (2006.01)
(52) U.S. Cl.
  CPC . *G02F 2202/22* (2013.01); *G09G 2300/0426* (2013.01); *G09G 2330/04* (2013.01)

(56) References Cited

U.S. PATENT DOCUMENTS

| | | | | |
|---|---|---|---|---|
| 2002/0018154 | A1* | 2/2002 | Yoo | G02F 1/136204 349/40 |
| 2007/0246778 | A1* | 10/2007 | Liou | H01L 27/0266 257/362 |
| 2007/0268420 | A1* | 11/2007 | Tsai | G02F 1/13452 349/40 |
| 2008/0043162 | A1* | 2/2008 | Tung | G02F 1/136204 349/40 |
| 2008/0143702 | A1* | 6/2008 | Park | G09G 3/3648 345/211 |
| 2012/0087460 | A1* | 4/2012 | Moriwaki | H01L 27/12 377/64 |
| 2014/0126093 | A1* | 5/2014 | Duan | G02F 1/136204 361/56 |

FOREIGN PATENT DOCUMENTS

| | | |
|---|---|---|
| CN | 103944154 A | 7/2014 |
| CN | 105366648 A | 3/2016 |
| JP | 2002270766 A | 9/2002 |

\* cited by examiner

DISPLAY PANEL HAVING ELECTROSTATIC DISCHARGE CIRCUIT AND DISPLAY DEVICE

The present application claims priority to the Chinese Patent Application No. CN2017103209648, filed to the Chinese Patent Office on May 9, 2017, and entitled "DISPLAY PANEL", which is incorporated herein by reference in its entirety.

TECHNICAL FIELD

The present application relates to the technical field of displays, and particularly relates to a display panel and display device.

BACKGROUND

The description herein provides only background information related to this application, but does not necessarily constitute the existing technology.

Liquid crystal display apparatuses (LCD apparatuses) have numerous advantages, such as a thin body, power saving, no radiation, etc., and are widely used. Most liquid crystal display apparatuses in a current market are backlit liquid crystal display apparatuses, each including a liquid crystal panel and a backlight module. Working principle of the liquid crystal panel is that liquid crystals are put in two parallel glass substrates, and a driving voltage is applied to two glass substrates to control rotational direction of the liquid crystals, to refract light rays of the backlight module to generate a picture.

Thin film transistor liquid crystal display apparatuses (TFT-LCD apparatuses) currently maintain a leading status in the display field because of low power consumption, excellent picture quality, high production yield, and other properties. Similarly, the TFT-LCD apparatus includes a liquid crystal panel and a backlight module. The display panel includes a color filter substrate (CF substrate), a thin film transistor substrate (TFT substrate), a mask and transparent electrodes on relative inner sides of the above substrates. A layer of liquid crystals (LC) is positioned between two substrates.

However, for electrostatic discharge (ESD), if the ESD exceeds a certain voltage, then an integrated circuit chip medium is punctured, a chip wire is broken, leakage current is increased to accelerate aging, electric performance parameters are changed, and the like. Thus, protection for the ESD is very important.

SUMMARY

A technical problem to be solved by the present application is to provide a display panel having a reliable and effective protection circuit.

A purpose of the present application is realized through a technical solution as follows.

A display panel includes: a substrate including a plurality of pixel regions, and an electrostatic discharge circuit disposed on the substrate, where the electrostatic discharge circuit includes a voltage gate high terminal, a voltage gate low terminal, an electrostatic input end and a common voltage terminal coupled with components of the display panel, and a first discharge circuit, where an output end of the first discharge circuit is connected to the voltage gate high terminal and the voltage gate low terminal respectively and a control end and an input end of the first discharge circuit are connected to the electrostatic input end, and a second discharge circuit, where an input end of the second discharge circuit is connected to the electrostatic input end, and an output end of the second discharge circuit is connected to the common voltage terminal.

Optionally, the second discharge circuit includes a first conducting line with one end connected to the common voltage terminal. The common voltage terminal is connected to ground (GND).

Optionally, the second discharge circuit includes a first conducting line with one end connected to the common voltage terminal. The common voltage terminal is connected to a common voltage end of the display panel.

Optionally, the second discharge circuit includes a third thin film transistor. An input end of the third thin film transistor are connected to the electrostatic input end, a control end of the third thin film transistor are connected to the electrostatic input end. An output end of the third thin film transistor is connected to the common voltage terminal.

Optionally, the second discharge circuit includes a capacitor. A first end of the capacitor is connected to the electrostatic input end. A second end of the capacitor is connected to the control end of the third thin film transistor.

The second discharge circuit includes a fourth thin film transistor. An input end of a fourth thin film transistor is connected to the second end of the capacitor. A control end of the fourth thin film transistor is connected to the voltage gate high terminal. An output end of the fourth thin transistor is connected to the voltage gate low terminal. Or, an input end of a fourth thin film transistor is connected to the second end of the capacitor. A control end of the fourth thin film transistor is connected to the voltage gate low terminal. An output end of the fourth thin film transistor is connected to the voltage gate high terminal.

Optionally, the third N-type thin film transistor and the fourth thin film transistor are P-type thin film transistors.

Optionally, the third N-type thin film transistor and the fourth thin film transistor are N-type thin film transistors.

Optionally, the first discharge circuit includes a first N-type thin film transistor and a second N-type thin film transistor. A source of the first N-type thin film transistor is connected to the voltage gate high terminal. a gate of the first N-type thin film transistor is connected to a drain of the first N-type thin film transistor, and the gate and the drain of the first N-type thin film transistor are also connected to a source of the second N-type thin film transistor. A source of the second N-type thin film transistor is also connected to the electrostatic input end. A gate of the second N-type thin film transistor is connected to a drain of the second N-type thin film transistor, and the gate and the drain of the second N-type thin film transistor are also connected to the voltage gate low terminal; and the second discharge circuit includes a third N-type thin film transistor, a capacitor and a fourth N-type thin film transistor. A source of the third N-type thin film transistor is connected to a gate of the first N-type thin film transistor. A drain of the third N-type thin film transistor is connected to the common voltage terminal. The common voltage terminal is connected to GND. A first end of the capacitor is connected to the electrostatic input end. A second end of the capacitor is connected to a gate of the third N-type thin film transistor. A source of the fourth N-type thin film transistor is connected to the second end of the capacitor. A gate of the fourth N-type thin film transistor is connected to the voltage gate high terminal. A drain of the fourth N-type thin film transistor is connected to the voltage gate low terminal.

Optionally, the first discharge circuit includes a first P-type thin film transistor and a second P-type thin film transistor. A gate of the first P-type thin film transistor is connected to a drain of the first P-type thin film transistor, and the gate and the drain of the first P-type thin film transistor are also connected to the voltage gate high terminal. A source of the first P-type thin film transistor is connected to the electrostatic input end. A gate of the second P-type thin film transistor is connected to a drain of the second P-type thin film transistor, and the gate and the drain of the second P-type thin film transistor are also connected to the source of the first P-type thin film transistor. A source of the second P-type thin film transistor is connected to the voltage gate low terminal; and the second discharge circuit includes a third N-type thin film transistor, a capacitor and a fourth N-type thin film transistor. A source of the third N-type thin film transistor is connected to a gate of the first N-type thin film transistor. A drain of the third N-type thin film transistor is connected to the common voltage terminal. The common voltage terminal is connected to GND. A first end of the capacitor is connected to the electrostatic input end. A second end of the capacitor is connected to a gate of the third N-type thin film transistor. A source of the fourth N-type thin film transistor is connected to the second end of the capacitor. A gate of the fourth N-type thin film transistor is connected to the voltage gate high terminal. A drain of the fourth N-type thin film transistor is connected to the voltage gate low terminal.

Optionally, the first discharge circuit includes a first P-type thin film transistor and a second P-type thin film transistor. A gate of the first P-type thin film transistor is connected to a drain of the first P-type thin film transistor, and the gate and the dram of the first P-type thin film transistor are also connected to the voltage gate high terminal. A source of the first P-type thin film transistor is connected to the electrostatic input end. A gate of the second P-type thin film transistor is connected to a drain of the second P-type thin film transistor, and the gate and the drain of the second P-type thin film transistor are also connected to the source of the first P-type thin film transistor. A source of the second P-type thin film transistor is connected to the voltage gate low terminal; and the second discharge circuit includes a third P-type thin film transistor, a capacitor and a fourth P-type thin film transistor. A source of the third P-type thin film transistor is connected to a gate of the second P-type thin film transistor. A drain of the third P-type thin film transistor is connected to the common voltage terminal. The common voltage terminal is connected to GND. A first end of the capacitor is connected to the electrostatic input end. A second end of the capacitor is connected to a gate of the third P-type thin film transistor. A source of the fourth P-type thin film transistor is connected to the second end of the capacitor. A gate of the fourth P-type thin film transistor is connected to the voltage gate low terminal. A drain of the fourth P-type thin film transistor is connected to the voltage gate high terminal.

The display panel includes a gate integrated circuit. The voltage gate high terminal and the voltage gate low terminal are respectively connected at a thin film transistor voltage turn-on end and a thin film transistor voltage turn-off end of the gate integrated circuit.

The present application further discloses a display device include a backlight module and the above display panel.

In the present application, since the connected first discharge circuit and second discharge circuit act jointly and the other end of the second discharge circuit is connected to the common voltage terminal, an ESD current path is increased, and speed and number of leakage current are increased, thereby realizing a better protection for the display panel and prolonging service life.

BRIEF DESCRIPTION OF DRAWINGS

The drawings included are used for providing further understanding of embodiments of the present application, constitute portion of the description, and are used to illustrate implementation manners of the present application, and interpret principles of the present application together with text description. Apparently, the drawings in the following description are merely some embodiments of the present application, and for those of ordinary skill in the art, other drawings can also be obtained according to the drawings without contributing creative labor. In the drawings.

DETAILED DESCRIPTION

Specific structure and function details disclosed herein are only representative and are used for the purpose of describing exemplary embodiments of the present application. However, the present application may be specifically achieved in many alternative forms and shall not be interpreted to be only limited to the embodiments described herein.

It should be understood in the description of the present application that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present application and the simplification of the description rather than to indicate or imply that the indicated device or element must have a specific direction or constructed and operated in a specific direction, and therefore, shall not be understood as a limitation to the present application. In addition, the terms such as "first" and "second" are only used for the purpose of description, rather than being understood to indicate or imply relative importance or hint the number of indicated technical features. Thus, the feature limited by "first" and "second" can explicitly or impliedly include one or more features. In the description of the present application, the meaning of "a plurality of" is two or more unless otherwise specified. In addition, the term "comprise" and any variant are intended to cover non-exclusive inclusion.

It should be noted in the description of the present application that, unless otherwise specifically regulated and defined, terms such as "installation," "connected," and "connection" shall be understood in broad sense, and for example, may refer to fixed connection or detachable connection or integral connection, may refer to mechanical connection or electrical connection, and may refer to direct connection or indirect connection through an intermediate medium or inner communication of two elements. For those of ordinary skill in the art, the meanings of the above terms in the present application may be understood according to concrete conditions.

The terms used herein are intended to merely describe specific embodiments, not to limit the exemplary embodiments. Unless otherwise noted clearly in the context, singular forms "one" and "single" used herein are also intended to comprise plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

The present application will be further described in detail below in combination with the drawings and optional embodiments.

Figure 1:
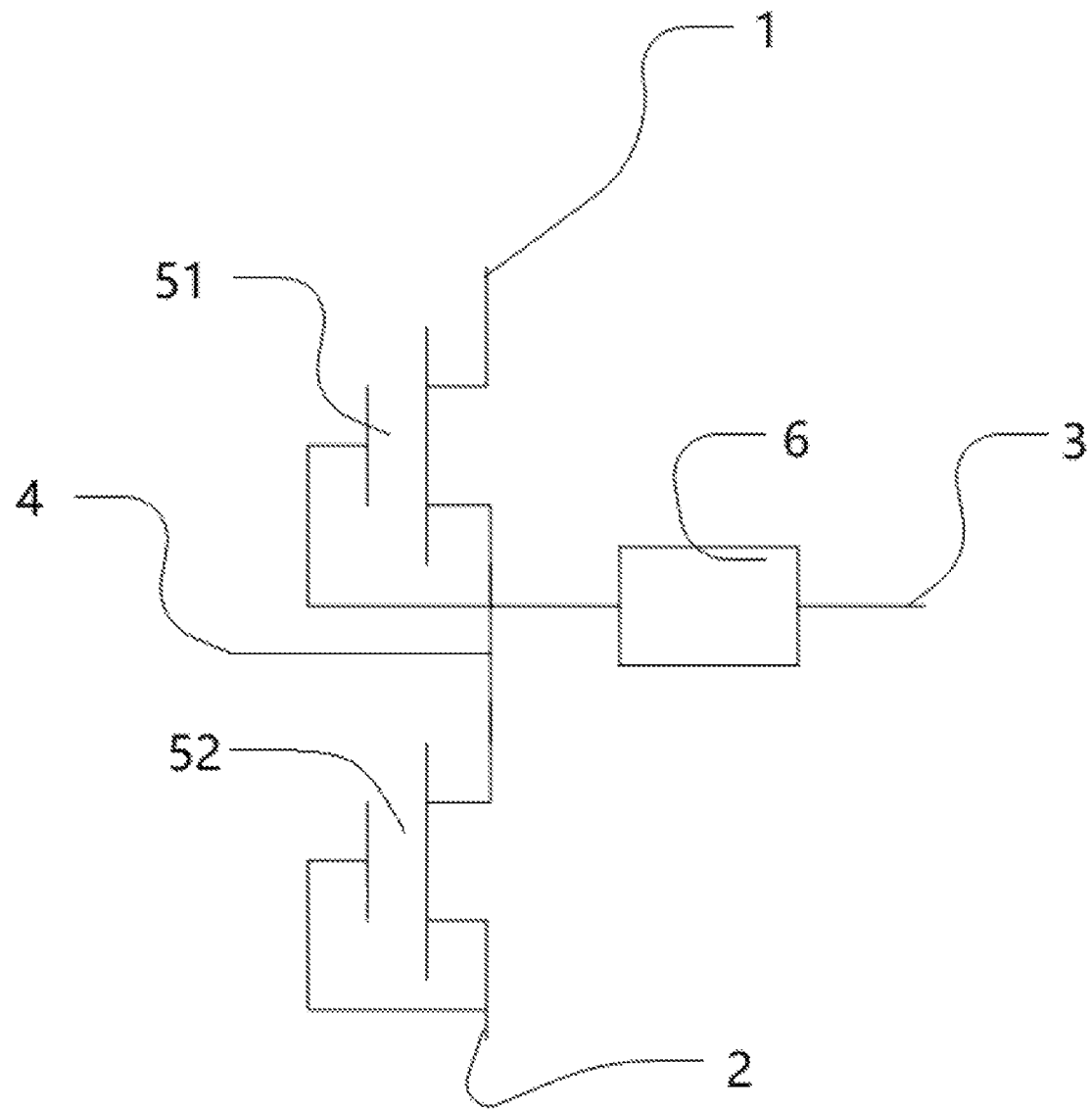
FIG. 1 is a schematic diagram of a protection circuit of a display panel in an embodiment of the present application.
Figure 2:
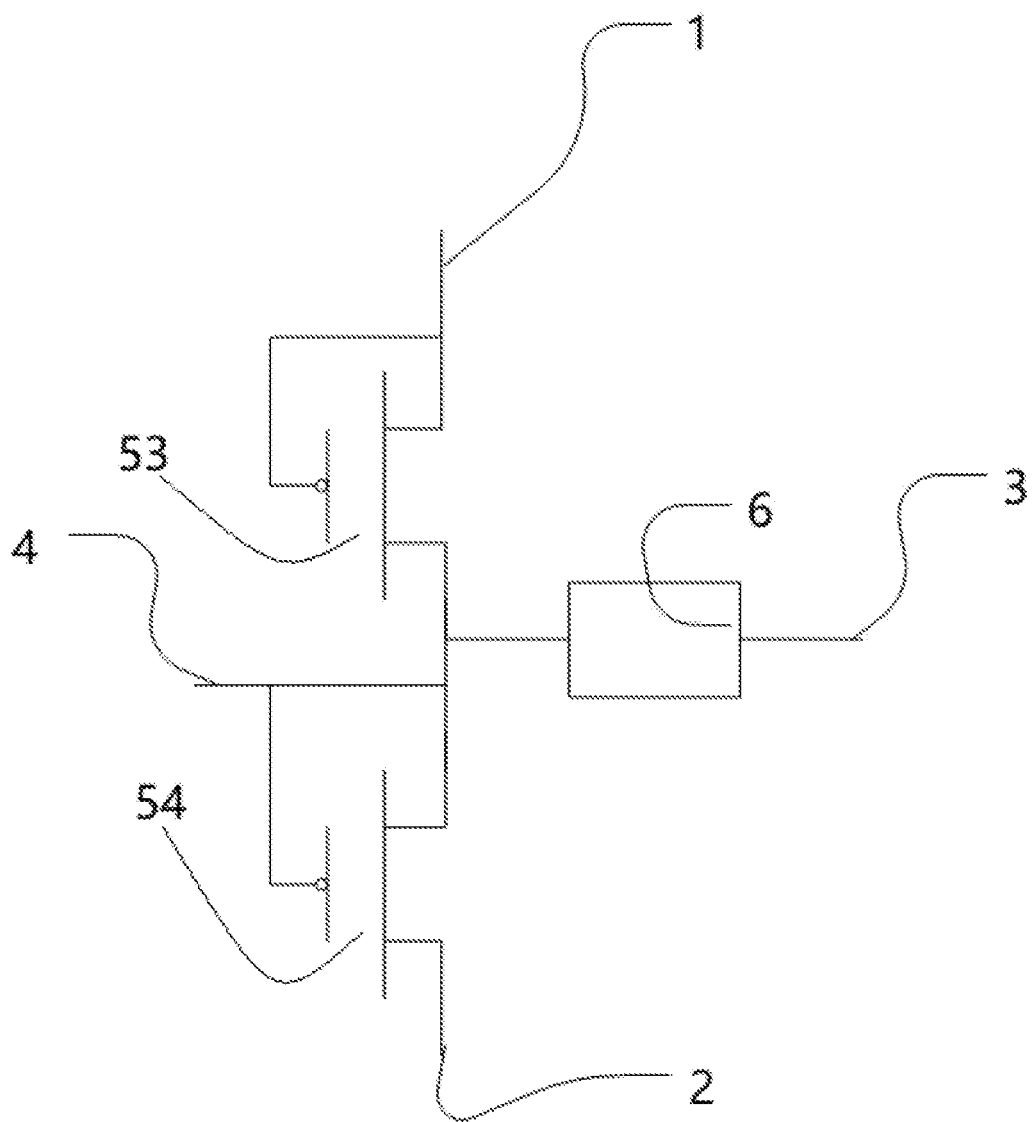
FIG. 2 is a schematic diagram of a protection circuit of a display panel in an embodiment of the present application.
Figure 9:
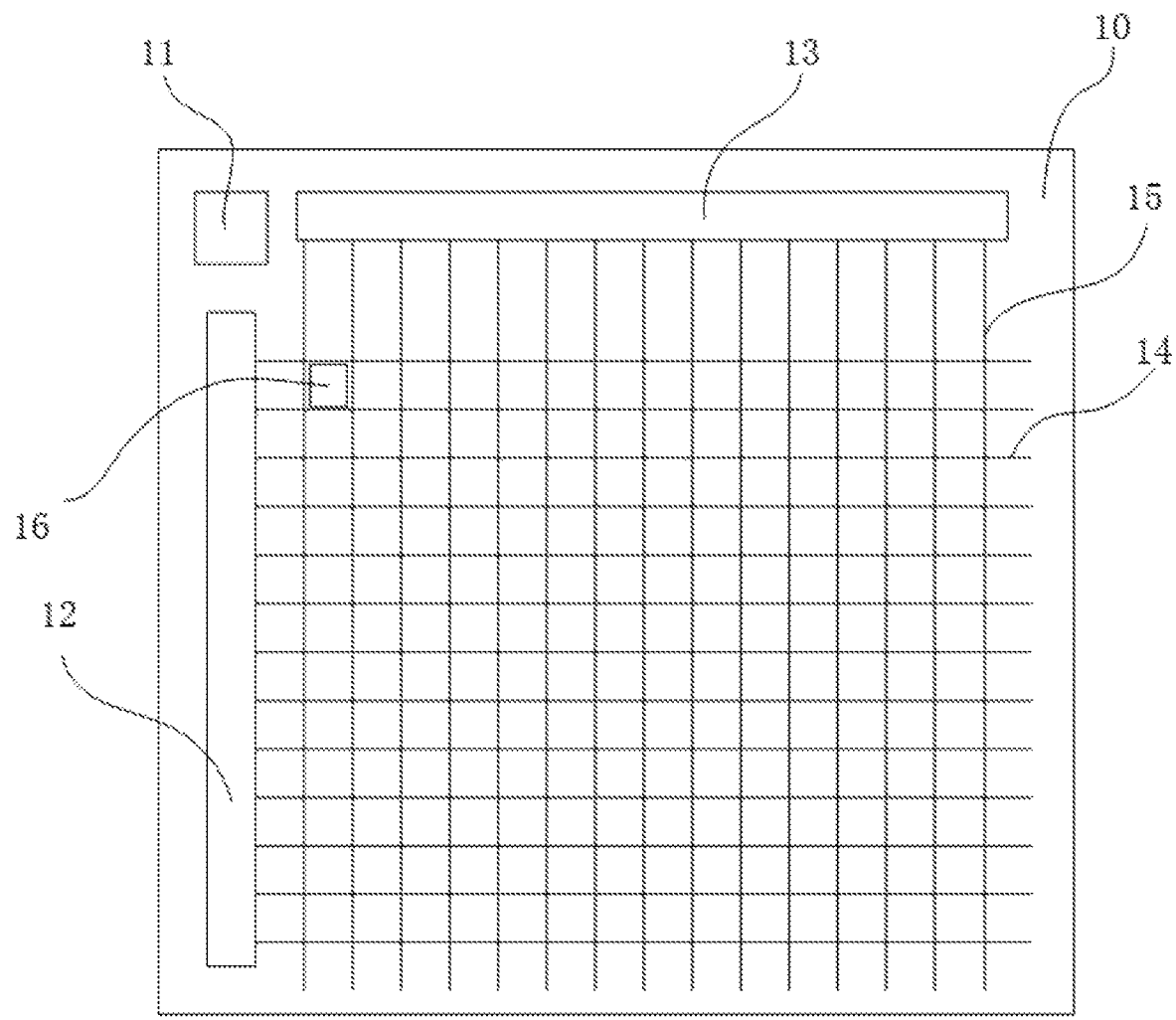
FIG. 9 is a structural schematic diagram of a display panel in an embodiment of the present application.

In one or more embodiments of the present application, as shown in FIGS. 1 to 2, the display panel includes: a substrate 10 including a plurality of pixel regions 16 and an electrostatic discharge circuit 11 disposed on the substrate 10 and including a voltage gate high terminal 1, a voltage gate low terminal 2, an electrostatic input end 4 and a common voltage terminal 3 coupled with components of the display panel; and a first discharge circuit, where an output end of the first discharge circuit is respectively connected to the voltage gate high terminal 1 and the voltage gate low terminal 2, and a control end and an input end of the first discharge circuit are connected to the electrostatic input end 4; and a second discharge circuit 6, where an input end of the second discharge unit circuit 6 is connected to the electrostatic input end 4, and an output end of the second discharge circuit 6 is connected to the common voltage terminal 3. The first discharge circuit includes a first thin film transistor and a second thin film transistor. An output end of the first thin film transistor is connected to the voltage gate high terminal 1. An input end of the first thin film transistor and an output end of the second thin film transistor are connected to the electrostatic input end 4. An input end of the second thin film transistor is connected to the voltage gate low terminal 2. In the present application, since the connected first discharge circuit and second discharge circuit 6 act jointly and the other end of the second discharge circuit 6 is connected to the common voltage terminal 3, an ESD current path is increased, and speed and number of leakage current are increased, thereby realizing a better protection for the display panel and prolonging service life. As shown in FIG. 9, an ESD circuit, a gate driving circuit 12 and a source driving circuit 13 are disposed on the substrate 10. The horizontally disposed scanning lines 14 and the vertically disposed data lines 15 are coupled with corresponding circuits. The plurality of data lines 15 and the plurality of scanning lines 14 are successively disposed to be intersected to form a plurality of pixel regions 16.

Specifically, the second discharge circuit includes a first conducting line with one end connected to the common voltage terminal 3. The common voltage terminal 3 is connected to GND. A line thickness required for a conducting line used between the voltage gate high terminal 1 (VGH) and the voltage gate low terminal 2 (VGL) is small. This is equivalent to a large resistor station. A relative leakage current is also small. A capability of the first discharge circuit alone to perform current leakage is insufficient. However, the second conducting line is connected to the ground (GND). A line width of the second conducting line is greatly larger than line widths of VGH and VGL. Therefore, dischargeable current is greater than original current to achieve a better protection. The second discharge circuit 6 includes a first conducting line with one end connected to the common voltage terminal 3. The common voltage terminal 3 is connected to a common voltage end of the display panel. However, the second conducting line is connected to the common voltage (VCOM). A line width of the second conducting line is greatly larger than line widths of VGH and VGL. Therefore, dischargeable current is greater than original current to achieve a better protection. The display panel includes a gate integrated circuit. The voltage gate high terminal 1 and the voltage gate low terminal 2 are respectively connected at a thin film transistor voltage turn-on end and a thin film transistor voltage turn-off end of the gate integrated circuit.

Figure 3:
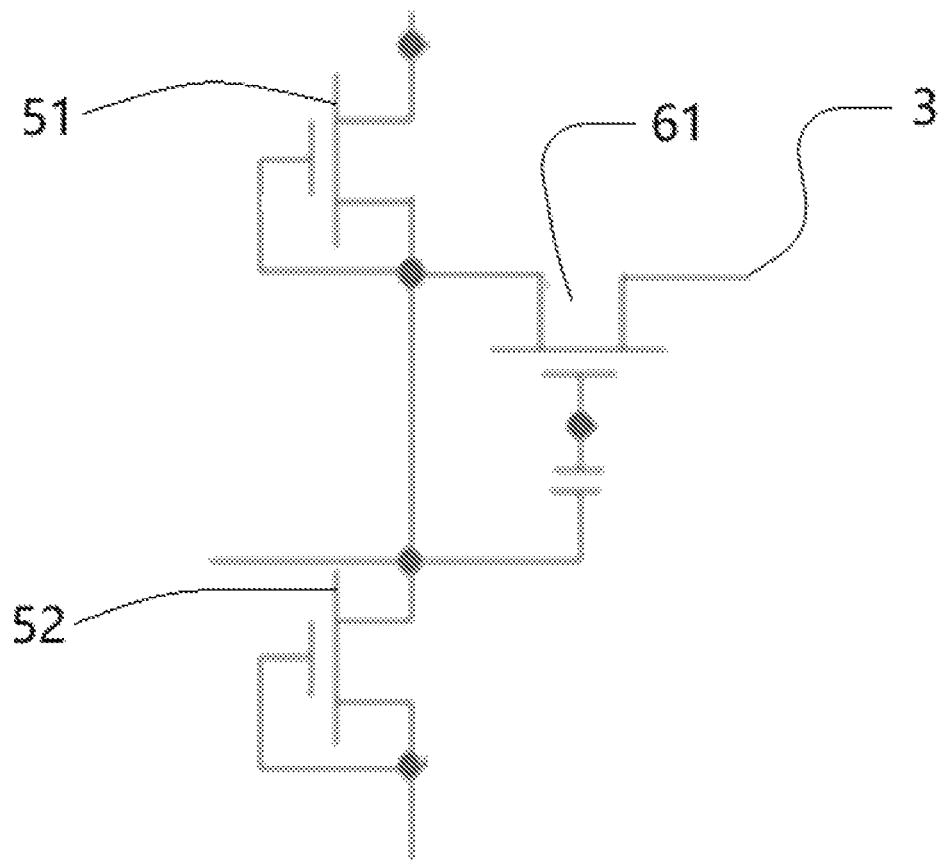
FIG. 3 is a schematic diagram of a protection circuit of a display panel in an embodiment of the present application.

Specifically, as shown in FIG. 3, the first thin film transistor and the second thin film transistor are N-type thin film transistors: a first N-type thin film transistor 51 and a second N-type thin film transistor 52. A source of the first N-type thin film transistor 51 is connected to the voltage gate high terminal 1. A gate of the first N-type thin film transistor 51 is connected to a drain of the first N-type thin film transistor 51, and the gate and the drain of the first N-type thin film transistor 51 are also connected to a source of the second N-type thin film transistor 52. A source of the second N-type thin film transistor 52 is also connected to the electrostatic input end 4. A gate of the second N-type thin film transistor 52 is connected to a drain of the second N-type thin film transistor 52, and the gate and the drain of the second N-type thin film transistor 52 are also connected to the voltage gate low terminal 2. A source of the third N-type thin film transistor 61 is connected to a gate of the first N-type thin film transistor 51. A drain of the third N-type thin film transistor 61 is connected to the common voltage terminal 3. The common voltage terminal 3 is connected to GND. A first end of the capacitor is connected to the electrostatic input end 4. A second end of the capacitor is connected to a gate of the third N-type thin film transistor 61.

When a positive large voltage instantaneously comes in the PIN, the first N-type thin film transistor 51 is conducted and first discharge current 81 is generated. Since the potential of the PIN is increased instantaneously and a potential of a connection point between the second end of the capacitor and the gate of the third N-type thin film transistor 61 is simultaneously increased under a special efficacy of capacitive coupling, the third N-type thin film transistor 61 is also conducted. At this moment, the positive large voltage of the PIN can leak current to GND. Since wiring of GND is usually thicker than wiring of VGL, a corresponding resistance value is greatly smaller than a resistance value of VGL and the second discharge current 82 is greater than the first discharge current 81.

Of course, the first discharge circuit can use a P-type thin film transistor, or use the N-type thin film transistor and the P-type thin film transistor together. For example, the first thin film transistor and the second thin film transistor are P-type thin film transistors: a first P-type thin film transistor 53 and a second P-type thin film transistor 54. A gate of the first P-type thin film transistor 53 is connected to a drain of the first P-type thin film transistor 53, and the gate and the drain of the first P-type thin film transistor 53 are also connected to the voltage gate high terminal 1. A source of the first P-type thin film transistor 53 is connected to the electrostatic input end 4. A gate of the second P-type thin film transistor 54 is connected to a drain of the second P-type thin film transistor 54, and the gate and the drain of the second P-type thin film transistor 54 are also connected to the source of the first P-type thin film transistor 53. A source of the second P-type thin film transistor 54 is connected to the voltage gate low terminal 2.

In one or more embodiments, An input end of a fourth thin film transistor is connected to the second end of the capacitor. A control end of the fourth thin film transistor is connected to the voltage gate high terminal 1. An output end of the forth thin film transistor is connected to the voltage gate low terminal 2; or an input end of a fourth thin film transistor is connected to the second end of the capacitor. A control end of the fourth thin film transistor is connected to the voltage gate low terminal 2. An output end of the fourth thin film transistor is connected to the voltage gate high terminal 1. Conduction of the fourth thin film transistor further completes a discharge function of the second discharge circuit 6. Meanwhile, a potential of the second end of the capacitor is pulled to be consistent with the common voltage terminal 3. Because of this, when the voltage range is within VGL to VGH, the third thin film transistor is not conducted to discharge to influence proper operation of the protection circuit.

Figure 4:
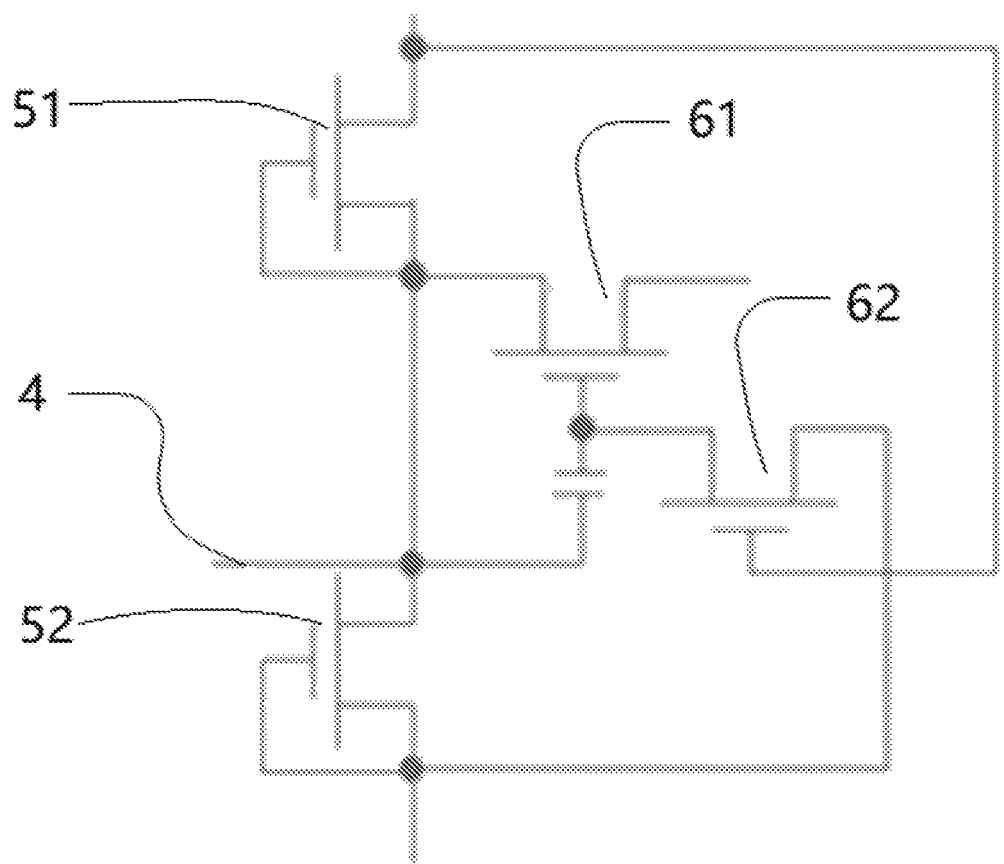
FIG. 4 is a schematic diagram of a protection circuit of a display panel in an embodiment of the present application.
Figure 5:
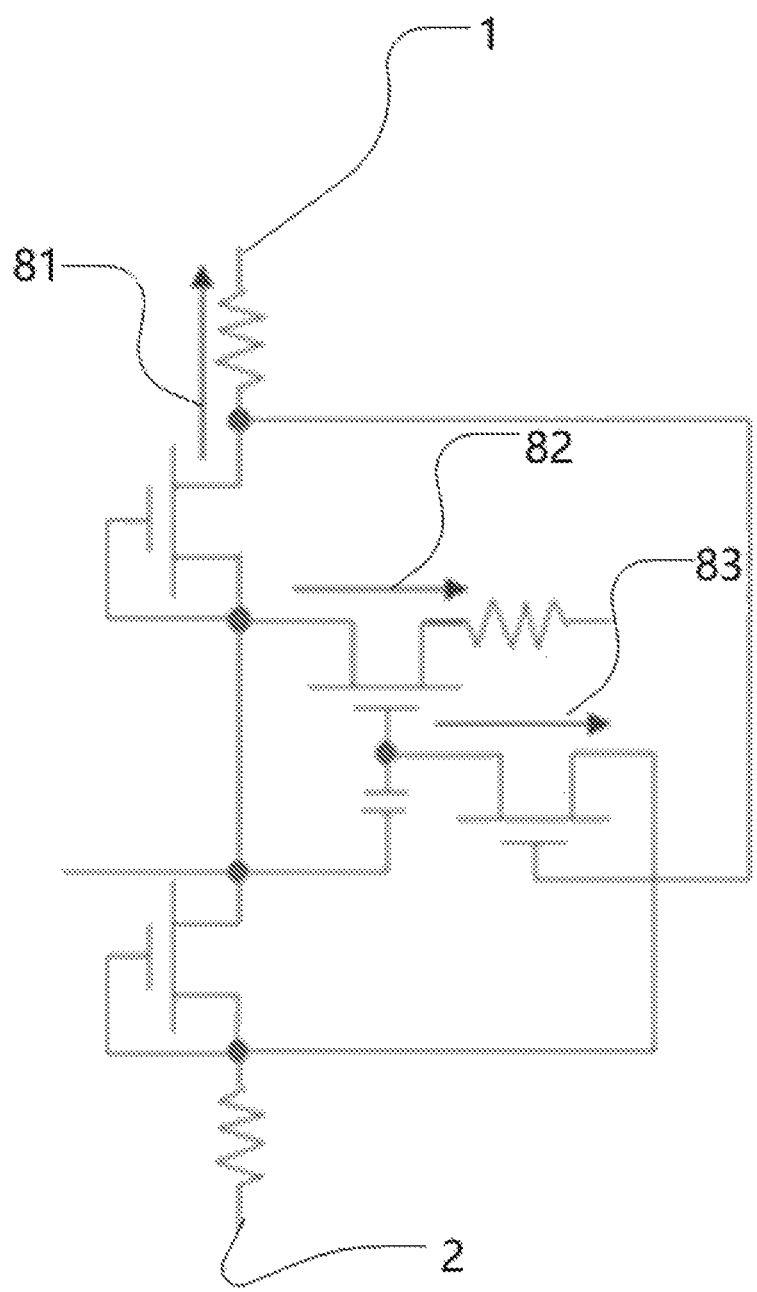
FIG. 5 is a schematic diagram of a protection circuit of a display panel in an embodiment of the present application.

Specifically, as shown in FIGS. 4 to 5, FIG. 5 can be regarded as an actual equivalent circuit of FIG. 4. The first thin film transistor and the second thin film transistor are N-type thin film transistors: a first N-type thin film transistor 51 and a second N-type thin film transistor 52. A source of the first N-type thin film transistor 51 is connected to the voltage gate high terminal 1. A gate of the first N-type thin film transistor 51 is connected to a drain of the first N-type thin film transistor 51, and the gate and the drain of the first N-type thin film transistor 51 are also connected to a source of the second N-type thin film transistor 52. A source of the second N-type thin film transistor 52 is also connected to the electrostatic input end 4. A gate of the second N-type thin film transistor 52 is connected to a drain of the second N-type thin film transistor 52, and the gate and the drain of the second N-type thin film transistor 52 are also connected to the voltage gate low terminal 2. The second discharge circuit 6 includes a third N-type thin film transistor 61, a capacitor and a fourth N-type thin film transistor 62. A source of the fourth third N-type thin film transistor 61 is connected to a gate of the first N-type thin film transistor 51. A drain of the third N-type thin film transistor 61 is connected to the common voltage terminal 3. The common voltage terminal 3 is connected to GND. A first end of the capacitor is connected to the electrostatic input end 4. A second end of the capacitor is connected to a gate of the third N-type thin film transistor 61. A source of the fourth N-type thin film transistor 62 is connected to the second end of the capacitor. A gate of the fourth N-type thin film transistor 62 is connected to the voltage gate high terminal 1. A drain of the fourth N-type thin film transistor 62 is connected to the voltage gate low terminal 2. This is an embodiment of the protection circuit and defines specifically used electrical elements and connection relationships. Since the potential of the PIN is increased instantaneously and a potential of a connection point between the second end of the capacitor and the gate of the third N-type thin film transistor 61 is simultaneously increased under a special efficacy of capacitive coupling, the third N-type thin film transistor 61 is also conducted. At this moment, the positive large voltage of the PIN can leak current to GND. Since wiring of GND is usually thicker than wiring of VGL a corresponding resistance value is greatly smaller than a resistance value of VGL and the second discharge current 82 is greater than the first discharge current 81. However, the fourth N-type thin film transistor 62 also simultaneously pulls the potential of a connection point between the second end of the capacitor and the gate of the third N-type thin film transistor 61 to GND. Therefore, when a positive large voltage instantaneously comes in the PIN, the leaked current is a sum of the first discharge current 81, the second discharge current 82 and the third discharge current 83. Compared with an individual action of the first discharge circuit a total leakage current is larger and a better protection is realized.

Of course, the first discharge circuit can use a P-type thin film transistor, or use the N-type thin film transistor and the P-type thin film transistor together. For example, the first thin film transistor and the second thin film transistor are P-type thin film transistors: a first P-type thin film transistor 53 and a second P-type thin film transistor 54. A gate of the first P-type thin film transistor 53 is connected to a drain of the first P-type thin film transistor 53, and the gate and the drain of the first P-type thin film transistor 53 are also connected to the voltage gate high terminal 1. A source of the first P-type thin film transistor 53 is connected to the electrostatic input end 4. A gate of the second P-type thin film transistor 54 is connected to a drain of the second P-type thin film transistor 54, and the gate and the drain of the second P-type thin film transistor 54 are also connected to the source of the first P-type thin film transistor 53. A source of the second P-type thin film transistor 54 is connected to the voltage gate low terminal 2.

In one or more embodiments, as shown in FIG. 2, where the first discharge circuit include a first P-type thin film transistor 53 and a second P-type thin film transistor 54, a gate of the first P-type thin film transistor 53 is connected to a drain of the first P-type thin film transistor 53, the gate and the dram of the first P-type thin film transistor 53 are also connected to the voltage gate high terminal 1, a source of the first P-type thin film transistor 53 is connected to the electrostatic input end 4, a gate of the second P-type thin film transistor 54 is connected to a drain of the second P-type thin film transistor 54, the gate and the drain of the second P-type thin film transistor 54 are also connected to the source of the first P-type thin film transistor 53, and a source of the second P-type thin film transistor 54 is connected to the voltage gate low terminal 2. and a second discharge unit, where an input end of the second discharge unit is connected to the electrostatic input end, and an output end of the second discharge unit is connected to the common voltage terminal. In the present application, since the connected first discharge unit and second discharge unit act jointly and the other end of the second discharge unit is connected to the common voltage terminal, an ESD current path is increased, and speed and number of leakage current are increased, thereby realizing a better protection for the display panel and prolonging service life.

In one or more embodiments, the second discharge circuit 6 include a third thin film transistor and a capacitor. An input end oft third thin film transistor are connected to the electrostatic input end 4. A control end of third thin film transistor are connected to the electrostatic input end 4. An output end of third thin film transistor is connected to the common voltage terminal 3. The second discharge circuit 6 leaks current through the third thin film transistor, which is simple, effective and reliable in arrangement. The second discharge circuit 6 include: A first end of the capacitor is connected to the electrostatic input end 4, and a second end of the capacitor is connected to the control end of the third thin film transistor. Through characteristics of direct current blocking, alternating current conducting, high frequency conducting and low frequency blocking of the capacitor, when a voltage range is within VGL to VGH, the second discharge circuit 6 does not participate in the effect. Meanwhile, when the voltage range is not within VGL to VGH, for example, when a positive large voltage appears instantaneously, the second discharge circuit 6 can be properly operated without producing VGL current reserved by the second thin film transistor. Therefore, if an input voltage range of PIN is within VGL to VGH, because a capacitor can be regarded as an open circuit in direct current, the capacitor and the thin film transistor do not act.

Figure 6:
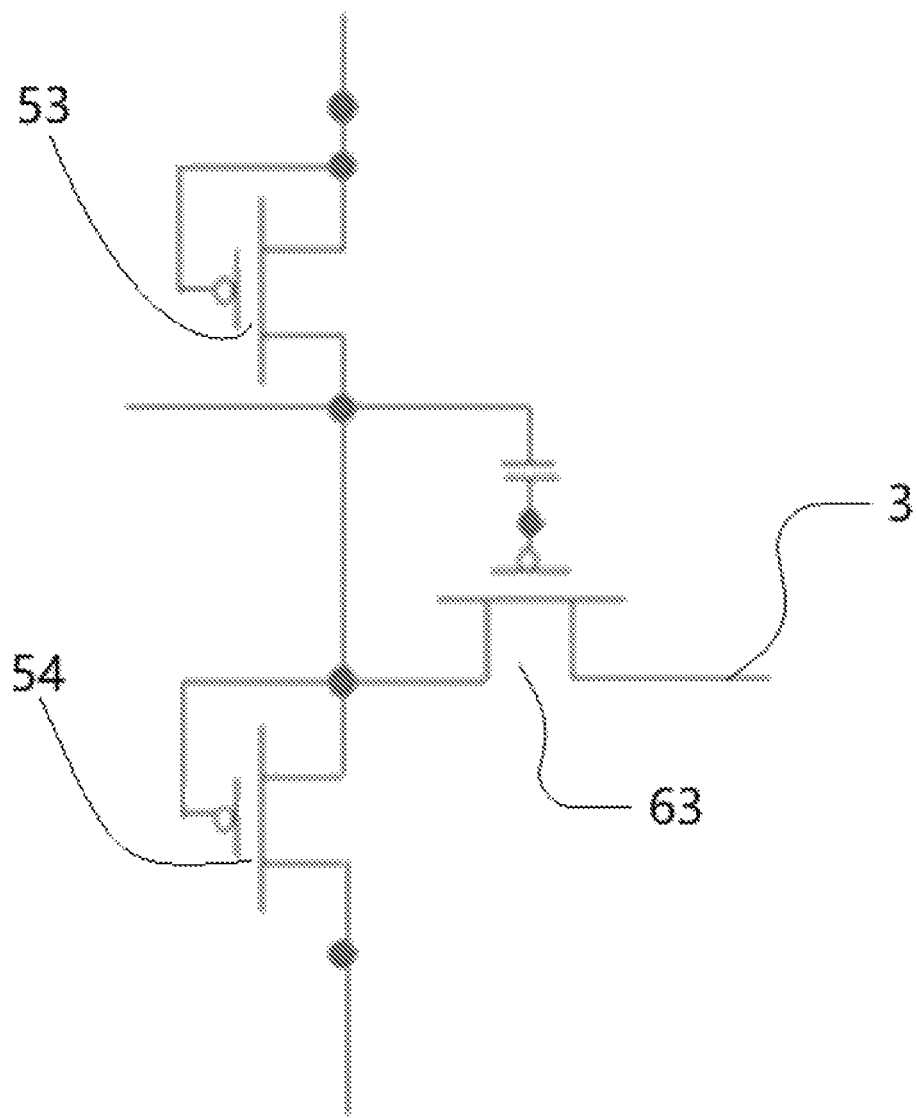
FIG. 6 is a schematic diagram of a protection circuit of a display panel in an embodiment of the present application.

Specifically, as shown in FIG. 6, the third thin film transistor is a P-type thin film transistor: a third P-type thin film transistor 63. A source of the third P-type thin film transistor 63 is connected to a gate of the second P-type thin film transistor 54. A drain of the third P-type thin film transistor 63 is connected to the common voltage terminal 3. The common voltage terminal 3 is connected to GND. A first end of the capacitor is connected to the electrostatic input end 4. A second end of the capacitor is connected to a gate of the third P-type thin film transistor 63. Since the potential of the PIN is increased instantaneously and a potential of a connection point between the second end of the capacitor and the gate of the third N-type thin film transistor 61 is simultaneously increased under a special efficacy of capacitive coupling, the third N-type thin film transistor 61 is also conducted. At this moment, the positive large voltage of the PIN can leak current to GND. Since wiring of GND is usually thicker than wiring of VGL, a corresponding resistance value is greatly smaller than a resistance value of VGL and the second discharge current 82 is greater than the first discharge current 81.

In one or more embodiments, the second discharge circuit 6 includes a third thin film transistor, a capacitor and a fourth thin film transistor. An input end of the third thin film transistor are connected to the electrostatic input end 4. A control end of the third thin film transistor are connected to the electrostatic input end 4. An output end of the third thin film transistor is connected to the common voltage terminal 3. The second discharge circuit 6 leaks current through the third thin film transistor, which is simple, effective and reliable in arrangement. The second discharge circuit 6 includes: A first end of the capacitor is connected to the electrostatic input end 4, and a second end of the capacitor is connected to the control end of the third thin film transistor. Through characteristics of direct current blocking, alternating current conducting, high frequency conducting and low frequency blocking of the capacitor, when a voltage range is within VGL to VGH, the second discharge circuit 6 does not participate in the effect. Meanwhile, when the voltage range is not within VGL to VGH, for example, when a positive large voltage appears instantaneously, the second discharge circuit 6 can be properly operated without producing VGL current reserved by the second thin film transistor. Therefore, if an input voltage range of PIN is within VGL to VGH, because a capacitor can be regarded as an open circuit in direct current, the capacitor and the thin film transistor do not act. A control end of the fourth thin film transistor is connected to the voltage gate low terminal 2. An output end of the fourth thin film transistor is connected to the voltage gate high terminal 1. Conduction of the fourth thin film transistor further completes a discharge function of the second discharge circuit 6. Meanwhile, a potential of the second end of the capacitor is pulled to be consistent with the common voltage terminal 3. Because of this, when the voltage range is within VGL to VGH, the third thin film transistor is not conducted to discharge to influence proper operation of the protection circuit.

Figure 7:
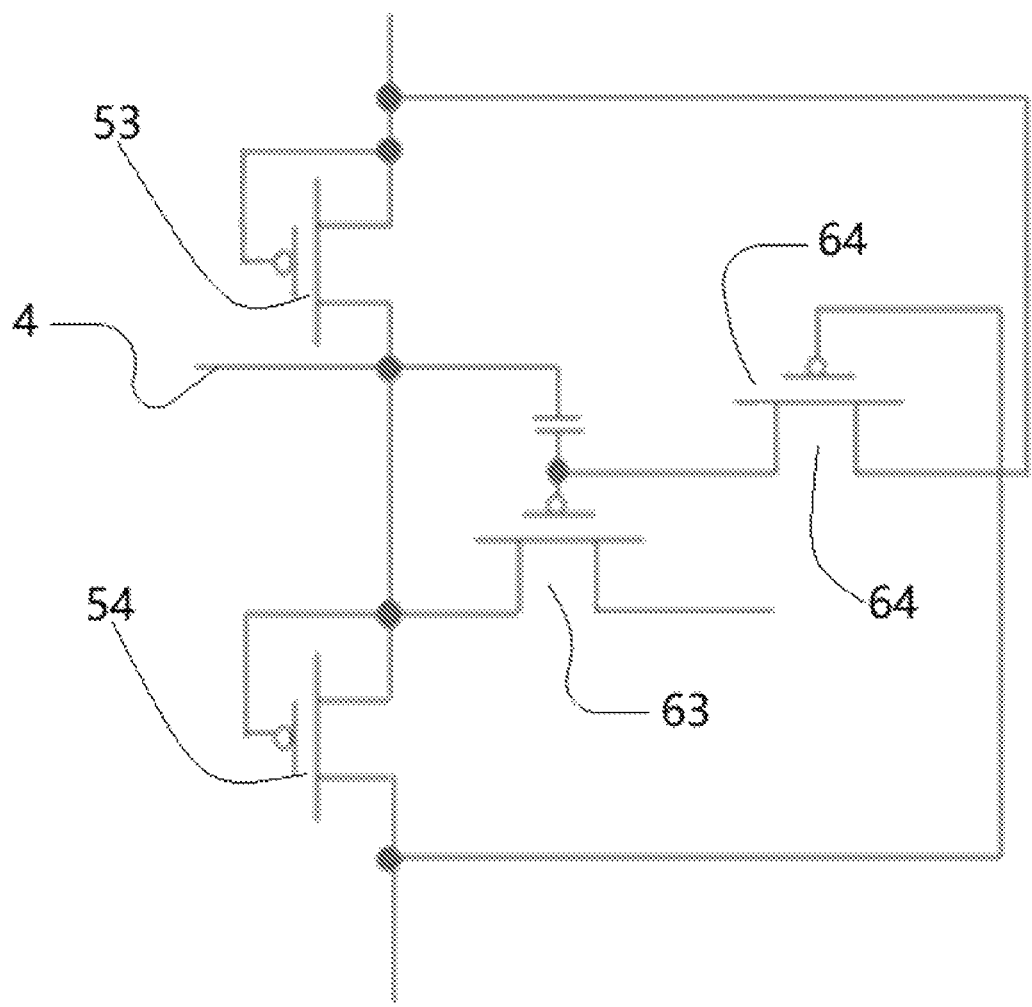
FIG. 7 is a schematic diagram of a protection circuit of a display panel in an embodiment of the present application.
Figure 8:
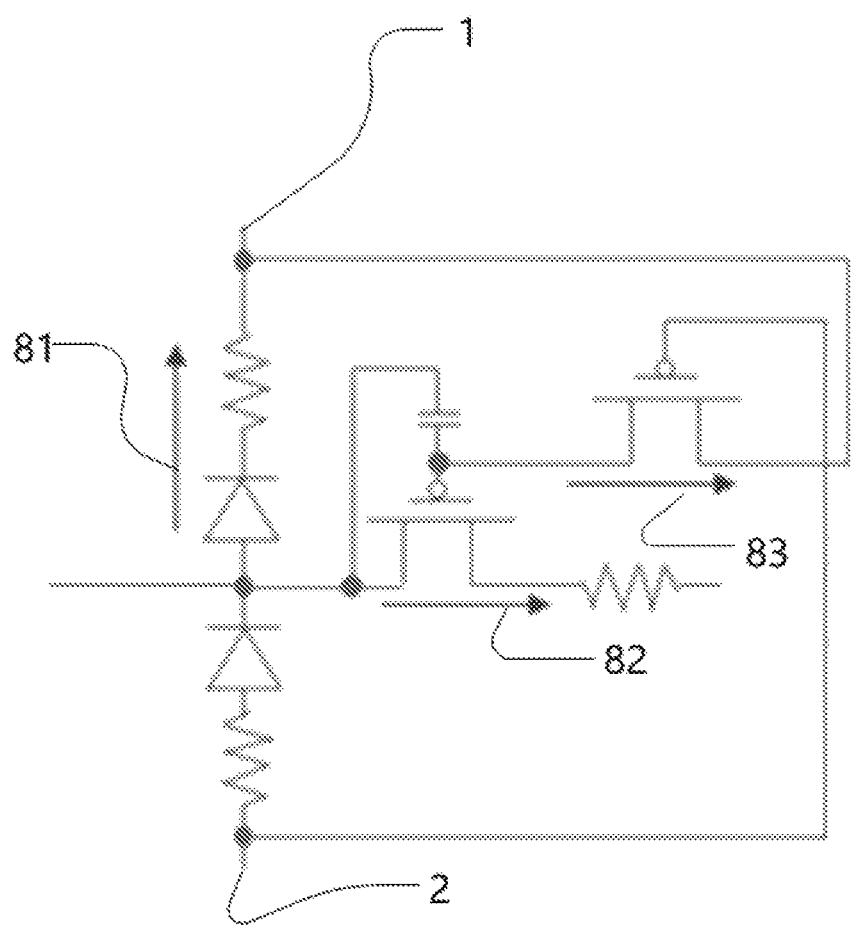
FIG. 8 is a schematic diagram of a protection circuit of a display panel in an embodiment of the present application.

Specifically, as shown in FIGS. 7 to 8, FIG. 8 can be regarded as an actual equivalent circuit of FIG. 7. The third thin film transistor and the fourth thin film transistor are P-type thin film transistors: a third P-type thin film transistor 63 and a fourth P-type thin film transistor 64. A source of the third P-type thin film transistor 63 is connected to a gate of the second P-type thin film transistor 54. A drain of the third P-type thin film transistor 63 is connected to the common voltage terminal 3. The common voltage terminal 3 is connected to GND. A first end of the capacitor is connected to the electrostatic input end 4. A second end of the capacitor is connected to a gate of the third P-type thin film transistor 63. A source of the fourth P-type thin film transistor 64 is connected to the second end of the capacitor. A gate of the fourth P-type thin film transistor 64 is connected to the voltage gate low terminal 2. A drain of the fourth P-type thin film transistor 64 is connected to the voltage gate high terminal 1. Since the potential of the PIN is increased instantaneously and a potential of a connection point between the second end of the capacitor and the gate of the third N-type thin film transistor 61 is simultaneously increased under a special efficacy of capacitive coupling, the third N-type thin film transistor 61 is also conducted. At this moment, the positive large voltage of the PIN can leak current to GND. Since wiring of GND is usually thicker than wiring of VGL, a corresponding resistance value is greatly smaller than a resistance value of VGL and the second discharge current 82 is greater than the first discharge current 81. However, the fourth N-type thin film transistor 62 also simultaneously pulls the potential of a connection point between the second end of the capacitor and the gate of the third N-type thin film transistor 61 to GND. Therefore, when a positive large voltage instantaneously comes in the PIN, the leaked current is a sum of the first discharge current 81, the second discharge current 82 and the third discharge current 83. Compared with an individual action of the first discharge circuit, a total leakage current is larger and a better protection is realized.

In one or more embodiments, the present application further discloses a display device include a backlight module and the above display panel.

It should be noted that the substrate can be made of glass, plastics, etc. in the above embodiment.

In the above embodiment, the display panel includes a liquid crystal panel, an organic light-emitting diode (OLED) panel, a curved surface type panel, a plasma panel and the like. By taking the liquid crystal panel as an example, the liquid crystal panel includes a thin film transistor substrate (TFT Substrate) and a color filter substrate (CF Substrate). The TFT substrate and the CF substrate are disposed opposite to each other. Liquid crystals and photo spacers (PS) are disposed between the TFT substrate and the CF substrate. A thin film transistor (TFT) is disposed on the TFT substrate. A color filter layer is disposed on the CF substrate.

In the above embodiment, the CF substrate may include a TFT array. A color filter and the TFT array may be formed on the same substrate. The TFT substrate may include the color filter layer.

In the above embodiment, the display panel of the present application may be a curved surface type panel.

The above contents are further detailed descriptions of the present application in combination with specific optional embodiments. However, the specific implementation of the present application shall not be considered to be only limited to these descriptions. For those of ordinary skill in the art to which the present application belongs, several simple deductions or replacements may be made without departing from the conception of the present application, all of which shall be considered to belong to the protection scope of the present application.

What is claimed is:

1. A display panel, comprising:
a substrate comprise a plurality of pixel regions; and
an electrostatic discharge circuit disposed on the substrate;
wherein the electrostatic discharge circuit comprises a voltage gate high terminal (VGH terminal), a voltage gate low terminal (VGL terminal), an electrostatic input end and a common voltage terminal (VCOM terminal) coupled with components of the display panel;
a first discharge circuit, wherein an output end of the first discharge circuit is connected to the voltage gate high terminal and the voltage gate low terminal respectively, a control end of the first discharge circuit are connected to the electrostatic input end, and an input end of the first discharge circuit are connected to the electrostatic input end; and
a second discharge circuit, wherein an input end of the second discharge circuit is connected to the electrostatic input end, and an output end of the second discharge circuit is connected to the common voltage terminal;
wherein the first discharge circuit comprises a first N-type thin film transistor and a second N-type thin film transistor, a source of the first N-type thin film transistor is connected to the voltage gate high terminal, a gate of the first N-type thin film transistor is connected to a drain of the first N-type thin film transistor, and the gate and the drain of the first N-type thin film transistor are also connected to a source of the second N-type thin film transistor, the source of the second N-type thin film transistor is also connected to the electrostatic input end, a gate of the second N-type thin film transistor is connected to a drain of the second N-type thin film transistor, and the gate and the drain of the second N-type thin film transistor are also connected to the voltage gate low terminal; and
the second discharge circuit comprises a third N-type thin film transistor, a capacitor and a fourth N-type thin film transistor, a source of the third N-type thin film transistor is connected to the gate of the first P-type thin film transistor, a drain of the third N-type thin film transistor is connected to the common voltage terminal, the common voltage terminal is connected to GND, a first end of the capacitor is connected to the electrostatic input end, a second end of the capacitor is connected to a gate of the third N-type thin film transistor, a source of the fourth N-type thin film transistor is connected to the second end of the capacitor, a gate of the fourth N-type thin film transistor is connected to the voltage gate high terminal, a drain of the fourth N-type thin film transistor is connected to the voltage gate low terminal, the display panel comprises a gate integrated circuit, and the voltage gate high terminal and the voltage gate low terminal are respectively connected at a thin film transistor voltage turn-on end and a thin film transistor voltage turn-off end of the gate integrated circuit.

2. A display panel, comprising:
a substrate including a plurality of pixel regions; and
an electrostatic discharge circuit disposed on the substrate;
wherein the electrostatic discharge circuit comprises a voltage gate high terminal, a voltage gate low terminal, an electrostatic input end and a common voltage terminal coupled with components of the display panel; and
a first discharge circuit, wherein an output end of the first discharge circuit is connected to the voltage gate high terminal and the voltage gate low terminal respectively, a control end of the first discharge circuit is connected to the electrostatic input end, and an input end of the first discharge circuit is connected to the electrostatic input end; and
a second discharge circuit, wherein an input end of the second discharge circuit is connected to the electrostatic input end, and an output end of the second discharge circuit is connected to the common voltage terminal.

3. The display panel according to claim 2, wherein the second discharge circuit comprises a first conducting line with one end connected to the common voltage terminal, and the common voltage terminal is connected to GND.

4. The display panel according to claim 2, wherein the second discharge circuit comprises a first conducting line with one end connected to the common voltage terminal, and the common voltage terminal is connected to a common voltage end of the display panel.

5. The display panel according to claim 2, wherein the second discharge circuit comprises a third thin film transistor, an input end of the third thin film transistor is connected to the electrostatic input end, a control end of the third thin film transistor is connected to the electrostatic input end, and an output end of the third thin film transistor is connected to the common voltage terminal.

6. The display panel according to claim 5, wherein the second discharge circuit comprises a capacitor, a first end of the capacitor is connected to the electrostatic input end, and a second end of the capacitor is connected to the control end of the third thin film transistor.

7. The display panel according to claim 6, wherein the second discharge circuit comprises a fourth thin film transistor, an input end of a fourth thin film transistor is connected to the second end of the capacitor, a control end of the fourth thin film transistor is connected to the voltage gate high terminal, an output end of the fourth thin film transistor is connected to the voltage gate low terminal; or, an input end of a fourth thin film transistor is connected to the second end of the capacitor, a control end of the fourth thin film transistor is connected to the voltage gate low terminal, and an output end of the fourth thin film transistor is connected to the voltage gate high terminal.

8. The display panel according to claim 5, wherein the third thin film transistor and the fourth thin film transistor are P-type Thin film transistors.

9. The display panel according to claim 6, wherein the third the third thin film transistor and the fourth thin film transistor are N-type thin film transistors.

10. The display panel according to claim 2, wherein the first discharge circuit comprises a first N-type thin film transistor and a second N-type thin film transistor, a source of the first N-type thin fin transistor is connected to the voltage gate high terminal, a gate of the first N-type thin film transistor is connected to a drain of the first N-type thin film transistor, and the gate and the drain of the first N-type thin film transistor are also connected to a source of the second N-type thin film transistor, the source of the second N-type thin film transistor is also connected to the electrostatic input end, a gate of the second N-type thin film transistor is connected to a drain of the second N-type thin film transistor, and the gate and the drain of the second N-type thin film transistor are also connected to the voltage gate low terminal; and the second discharge circuit comprises a third N-type thin film transistor, a capacitor and a fourth N-type thin film transistor, a source of the third N-type thin film transistor is connected to a gate of the first N-type thin film transistor, a drain of the third N-type thin film transistor is connected to the common voltage terminal, the common voltage terminal is connected to GND, a first end of the capacitor is connected to the electrostatic input end, a second end of the capacitor is connected to a gate of the third N-type thin film transistor, a source of the fourth N-type thin film transistor is connected to the second end of the capacitor, a gate of the fourth N-type thin film transistor is connected to the voltage gate high terminal, and a drain of the fourth N-type thin film transistor is connected to the voltage gate low terminal.

11. The display panel according to claim 2, wherein the first discharge circuit comprises a first P-type thin film transistor and a second P-type thin film transistor, a gate of the first P-type thin film transistor is connected to a drain of the first P-type thin film transistor, and the gate and the drain of the first P-type thin film transistor are also connected to the voltage gate high terminal, a source of the first P-type thin film transistor is connected to the electrostatic input end, a gate of the second P-type thin film transistor is connected to a drain of the second P-type thin film transistor, and the gate and the drain of the second P-type thin film transistor are also connected to the source of the first P-type thin film transistor, and a source of the second P-type thin film transistor is connected to the voltage gate low terminal;

wherein the second discharge circuit comprises a third N-type thin film transistor, a capacitor and a fourth N-type thin film transistor, a source of the third N-type thin film transistor is connected to the gate of the first P-type thin film transistor, a drain of the third N-type thin film transistor is connected to the common voltage terminal, the common voltage terminal is connected to GND, a first end of the capacitor is connected to the electrostatic input end, a second end of the capacitor is connected to a gate of the third N-type thin film transistor, a source of the fourth N-type thin film transistor is connected to the second end of the capacitor, a gate of the fourth N-type thin film transistor is connected to the voltage gate high terminal, and a drain of the fourth N-type thin film transistor is connected to the voltage gate low terminal.

12. The display panel according to claim 2, wherein the first discharge circuit comprises a first P-type thin film transistor and a second P-type thin film transistor, a gate of the first P-type thin film transistor is connected to a drain of the first P-type thin film transistor, and the gate and the drain of the first P-type thin film transistor are also connected to the voltage gate high terminal, a source of the first P-type thin film transistor is connected to the electrostatic input end, a gate of the second P-type thin film transistor is connected to a drain of the second P-type thin film transistor, and the gate and the drain of the second P-type thin film transistor are also connected to the source of the first P-type thin film transistor, and a source of the second P-type thin film transistor is connected to the voltage gate low terminal; and the second discharge circuit comprises a third P-type thin film transistor, a capacitor and a fourth P-type thin film transistor, a source of the third P-type thin film transistor is connected to the gate of the second P-type thin film transistor, a drain of the third P-type thin film transistor is connected to the common voltage terminal, the common voltage terminal is connected to GND, a first end of the capacitor is connected to the electrostatic input end, a second end of the capacitor is connected to a gate of the third P-type thin film transistor, a source of the fourth P-type thin film transistor is connected to the second end of the capacitor, a gate of the fourth P-type thin film transistor is connected to the voltage gate low terminal, and a drain of the fourth P-type thin film transistor is connected to the voltage gate high terminal.

13. The display panel according to claim 2, wherein the display panel comprises a gate integrated circuit, and the voltage gate high terminal and the voltage gate low terminal are respectively connected at a thin film transistor voltage turn-on end and a thin film transistor voltage turn-off end of the gate integrated circuit.

14. A display device, comprising a display panel, comprising:
a substrate including a plurality of pixel regions; and
an electrostatic discharge circuit disposed on the substrate;
wherein the electrostatic discharge circuit comprises a voltage gate high terminal, a voltage gate low terminal, an electrostatic input end and a common voltage terminal coupled with components of the display panel; and
a first discharge circuit, wherein an output end of the first discharge circuit is connected to the voltage gate high terminal and the voltage gate low terminal respectively, a control end of the first discharge circuit is connected to the electrostatic input end, and an input end of the first discharge circuit is connected to the electrostatic input end; and
a second discharge circuit, wherein an input end of the second discharge circuit is connected to the electrostatic input end, and an output end of the second discharge circuit is connected to the common voltage terminal.

15. The display device according to claim 14, wherein the second discharge circuit comprises a first conducting line with one end connected to the common voltage terminal, and the common voltage terminal is connected to GND.

16. The display device according to claim 14, wherein the second discharge circuit comprises a first conducting line with one end connected to the common voltage terminal, and the common voltage terminal is connected to a common voltage end of the display panel.

17. The display device according to claim 14, wherein the second discharge circuit comprises a third thin film transistor, an input end of the third thin film transistor is connected to the electrostatic input end, a control end of the third thin film transistor is connected to the electrostatic input end, and an output end of the third thin film transistor is connected to the common voltage terminal.

18. The display device according to claim 17, wherein the second discharge circuit comprises a capacitor, a first end of the capacitor is connected to the electrostatic input end, and a second end of the capacitor is connected to the control end of the third thin film transistor.

19. The display device according to claim 18, wherein the second discharge circuit comprises a fourth thin film transistor, an input end of a fourth thin film transistor is connected to the second end of the capacitor, a control end of the fourth thin film transistor is connected to the voltage gate high terminal, an output end of the fourth thin film transistor is connected to the voltage gate low terminal, an input end of a fourth thin film transistor is connected to the second end of the capacitor.

20. The display device according to claim 18, wherein the second discharge circuit comprises a fourth thin film transistor, an input end of a fourth thin film transistor is connected to the second end of the capacitor, a control end of the fourth thin film transistor is connected to the voltage gate low terminal, and an output end of the fourth thin film transistor is connected to the voltage gate high terminal.

* * * * *